United States Patent [19]

Liebmann et al.

[11] Patent Number: 5,740,068
[45] Date of Patent: Apr. 14, 1998

[54] FIDELITY ENHANCEMENT OF LITHOGRAPHIC AND REACTIVE-ION-ETCHED IMAGES BY OPTICAL PROXIMITY CORRECTION

[75] Inventors: Lars Wolfgang Liebmann, Poughquag; Robert Thomas Sayah, Beacon, both of N.Y.; John Edward Barth, Jr., Williston, Vt.

[73] Assignee: International Business Machines Corporation, Armonk, N.Y.

[21] Appl. No.: 655,790

[22] Filed: May 30, 1996

[51] Int. Cl.[6] .................... G03F 7/00; H01J 37/304
[52] U.S. Cl. ............... 364/489; 364/488; 250/492.3; 250/492.22; 250/492.2
[58] Field of Search .................... 364/488, 489, 364/490; 430/4, 5; 250/492.2, 492.21, 492.22, 492.3

[56] References Cited

U.S. PATENT DOCUMENTS

| | | | |
|---|---|---|---|
| 4,812,962 | 3/1989 | Witt | 364/490 |
| 4,895,780 | 1/1990 | Nissan-Cohen et al. | 430/5 |
| 5,008,553 | 4/1991 | Abe | 364/490 |
| 5,086,398 | 2/1992 | Moriizumi | 364/490 |
| 5,159,201 | 10/1992 | Frei | 364/490 |
| 5,182,718 | 1/1993 | Harafuji et al. | 364/490 |
| 5,208,124 | 5/1993 | Sporon-Fiedler et al. | 430/5 |
| 5,210,696 | 5/1993 | Yano | 364/488 |
| 5,242,770 | 9/1993 | Chen et al. | 430/5 |
| 5,253,182 | 10/1993 | Suzuki | 364/489 |
| 5,278,421 | 1/1994 | Yoda et al. | 250/492.22 |
| 5,432,714 | 7/1995 | Chung et al. | 364/488 |
| 5,481,472 | 1/1996 | Chung et al. | 364/491 |
| 5,526,279 | 6/1996 | Dick | 364/491 |
| 5,553,273 | 9/1996 | Liebmann | 364/491 |
| 5,553,274 | 9/1996 | Liebmann | 364/491 |
| 5,631,110 | 5/1997 | Shioiri et al. | 430/5 |
| 5,657,235 | 8/1997 | Liebmann et al. | 364/474.24 |
| 5,663,017 | 9/1997 | Schinella et al. | 430/5 |
| 5,663,893 | 9/1997 | Wampler et al. | 364/491 |

FOREIGN PATENT DOCUMENTS

0 529 971 A1  8/1992  European Pat. Off. .

*Primary Examiner*—Vincent N. Trans
*Attorney, Agent, or Firm*—H. Daniel Schnurmann

[57] ABSTRACT

A method for performing optical proximity correction is disclosed that not only limits the optical proximity correction to electrically relevant structures, but also improves the accuracy of the corrections by processing individual feature edges, and minimizes the mask manufacturing impacts by avoiding the introduction of jogs into the design. Critical edge regions of the relevant electrical structures are analyzed, sorted and manipulated to receive optical proximity corrections.

23 Claims, 6 Drawing Sheets

FIDELITY ENHANCEMENT OF LITHOGRAPHIC AND REACTIVE-ION-ETCHED IMAGES BY OPTICAL PROXIMITY CORRECTION

CROSS REFERENCE TO RELATED APPLICATIONS

The present invention is related to U.S. patent application Ser. No. 08/423,597, filed on Apr. 7, 1995, entitled "Vertex Minimization in a Smart Optical Proximity Correction System", and to U.S. patent application Ser. No. 08/470,728, filed on Jun. 5, 1995, bearing the same title.

FIELD OF THE INVENTION

The present invention generally relates to the manufacture of very large scale integrated (VLSI) circuit devices and, more particularly, to a fidelity enhancement of lithographic and reactive-ion-etched (RIE) images through the use of optical proximity correction (OPC).

BACKGROUND OF THE INVENTION

Manufacturing of semiconductor devices is heavily dependent on the accurate replication of computer-aided-design (CAD) generated patterns onto the surface of a device substrate. The replication process is typically performed using optical lithography followed by a variety of subtractive (etch) and additive (deposition) processes. Optical lithography patterning involves the illumination of a metallic coated quartz plate known as a photomask which contains a magnified image of the computer generated pattern to be etched into the metallic layer. This illuminated image is reduced in size and patterned into a photosensitive film on the substrate. As a result of the interference and processing effects which occur during pattern transfer, images formed on the substrate deviate from their ideal dimensions and shape as represented by the computer images. These deviations depend on the characteristics of the patterns as well as on a variety of process conditions. Because these deviations can significantly effect the performance of the semiconductor device, many approaches have been pursued which focus on CAD compensation schemes which ensure a resultant ideal image.

The performance enhancement of advanced VLSI circuitry (i.e., speed enhancement versus dimension reduction of the circuits) is increasingly limited by the lack of pattern fidelity manifested in a series of lithography and RIE processes at increasingly small dimensions (e.g., sub 0.5 µm). In the photolithography process, a pattern is transferred from a photomask to a photosensitive film (resist) on the wafer. In the RIE process, this pattern in the resist is transferred into a variety of films on the wafer substrate.

An alternative to the costly development of processes with every higher effective resolution is the selective biasing of mask patterns to compensate for the pattern distortions occurring during wafer processing. The term Optical Proximity Correction (OPC) is commonly used to describe this process of selective mask biasing, even though the trend exists to include pattern distortions unrelated to the optical image transfer. The idea of biasing patterns to compensate for image transfer infidelities has been commonly applied to E-beam lithography to counteract the effects of back scattered electrons, both in the writing of photo masks and in direct wafer writing operations. An example of this technique can be found in U.S. Pat. No. 5,278,421.

OPC extends the use of the automatic pattern biasing concept to the two major pattern transfer processes used in VLSI technologies. Current implementations of OPC can be categorized as: 1) "rules-based", in which patterns are sorted and biased in a computer-aided-design (CAD) data set based on a set of rules that relate bias amounts to pattern attributes such as size, proximity, density; and 2) "convolution-based", in which CAD patterns are biased based on a particular pattern environment. Both the rules and convolution functions can be generated either from process simulations or empirical data. Examples of "rules-based" OPC implementations can be found in an article by Richard C. Henderson and Oberdan W. Otto, "CD Data Requirements for Proximity Effect Corrections," *14th Annual BACUS Symposium on Photomask Technology and Management* William L. Brodsky and Gilbert V. Shelden, Editors, Proc. SPIE 2322 (1994), pp. 218–228, and in an article by Oberdan W. Otto, Joseph G. Garofalo, K. K. Low, Chi-Min Yuan, Richard C. Henderson, Christopher Pierrat, Robert L. Kostelak, Sheila Vaidya, and P. K. Vasudev, "Automated optical proximity correction—a rules-based approach," *Optical/Laser Microlithography VII*, Timothy A. Brunner, Editor, Proc. SPIE 2197 (1994), pp. 278–293. Other examples of the "convolution-based" OPC implementations are found in an article by John P. Stirniman and Michael L. Rieger, entitled "Fast proximity correction with zone sampling," *Optical/Laser Microlithography VII*, Timothy A. Brunner, Editor, Proc. SPIE 2197 (1994), pp. 294–301, and in an article by John Stirniman and Michael Rieger, "Optimizing proximity correction for wafer fabrication processes," *14th Annual BACUS Symposium on Photomask Technology and Management*, William L. Brodsky and Gilbert V. Shelden, Editors, Proc. SPIE 2322 (1994), pp. 239–246. The common characteristic of these implementations that is most relevant to the present invention is that CAD data is treated as a collection of geometric shapes.

There are three major drawbacks with the current implementations. The first is that using the accuracy of the pattern replication of either the lithography or RIE processes as a success criterion for the OPC, rather than the improvement of device functionality, drives a lot of unnecessary biasing effort. This increases the cost of the OPC process by complicating the CAD data sets and design rule checking decks and by increasing the CAD, mask writer, and inspection tool data volumes without adding any value to the VLSI chip. This is true for one-dimensional compensations focusing on the correction of line widths, as well as for two-dimensional corrections dealing with phenomena such as corner rounding. The second problem relates to the addition of new vertices (jogs and corners) in the CAD layout, which significantly increases the data volume and complicates mask inspection. The goal of an efficient OPC routine has to be the minimization of vertices added in the biasing process. The third shortcoming of the current implementations is that symmetric CAD data size manipulations, such as shrink and expand operations which limit the granularity (and thereby the ultimate accuracy) of the OPC process to two design grids. The design grid defines the smallest distance any point in the CAD design can be moved. Symmetric sizing operations that manipulate entire shapes rather than individual edges, are limited to size increments of two design grids. This can introduce significant correction errors or can drive the need for costly design grid reductions.

OBJECTS OF THE INVENTION

Accordingly, it is a primary object of the present invention to improve VLSI chip performance by reducing processing induced critical dimension line width variations by means of optical proximity correction (OPC).

It is another object of the present invention to improve the efficiency of the OPC routine by limiting the correction efforts to functionally relevant structures or functionally relevant edges of structures.

It is a further object of the present invention to minimize the impact of the OPC on photo mask manufacturability and inspection by eliminating the introduction of new vertices (corners and jogs) in the CAD data.

It is yet another object of the present invention to reduce the OPC granularity, leading to improved accuracy at a given design grid, by operating on individual feature edges independently.

SUMMARY OF THE INVENTION

The present invention is generally directed to a method of improving the efficiency and accuracy of optical proximity correction. More particularly, the present invention performs optical proximity correction only on the elements that affect the operational performance of the VLSI circuit. Specifically, the optical proximity correction is performed on the edge portions of the elements that effect the operational performance of the VLSI circuit.

The method of the present invention for performing optical proximity correction not only limits the correction effort to electrically relevant structures, but also improves the accuracy of the corrections by processing individual feature edges, and minimizes the mask manufacturing impacts by avoiding the introduction of jogs into the design.

The method includes the steps of: inputting the chip design; identifying functionally relevant shapes; further identifying electrically relevant edge sections of the functionally relevant shapes; sorting the relevant edge sections by predetermined proximity characteristics; generating correction shapes alongside relevant feature edges; sizing of the correction shapes based on the bucket (or bin) that the respective relevant edge section was sorted into; biasing the original design by respectively adding or subtracting the sized correction shapes; and manipulating the resulting design data to eliminate corner jogs.

BRIEF DESCRIPTION OF THE DRAWINGS

The foregoing and other objects, aspects and advantages of the present invention will be better understood from the following detailed description of a preferred embodiment of the invention with reference to their drawings.

DETAILED DESCRIPTION OF THE PREFERRED EMBODIMENTS

Figure 1:
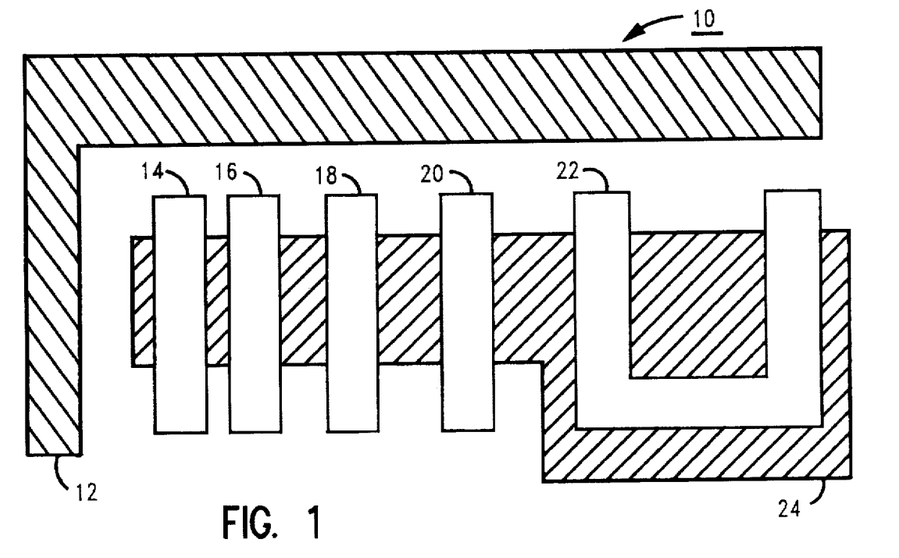
FIG. 1 is a plan view of the design shapes grouped into three categories, with the first being those requiring proximity correction, the second being those contributing to the proximity environment, and the third being those defining chip functionality.

With reference to the drawings, wherein the same reference numbers indicate the same elements throughout, there is shown in FIG. 1 an arrangement 10 that is illustrative of the various structural and operational elements of a VLSI device that are analyzed to establish VLSI processing proximity characteristics and which are sorted and manipulated to receive optical proximity correction. The arrangement 10 comprises a non-functional element 12, and functional electrical elements shown as, for example, polysilicon gate elements 14, 16, 18, 20, 22 and a diffusion region 24.

The non-functional element 12 does not receive proximity correction but does contribute to a proximity effect involved in the present invention and, therefore, is taken into account in the optical proximity correction determination of the present invention. The non-functional element 12 may be a fill pattern which, as known in the art, has a confirmed absence of the need of proximity effects. The non-functional element 12 may also be an electrically conductive member interconnecting the elements of the VLSI device and having a shape that need not be precise and, more importantly, has no need of proximity correction. Conversely, the polysilicon gates 14, 16, 18, 20 and 22, which are defined by their interaction with the diffusion region 24, are critical in the formation of VLSI circuit devices, and are therefore selected to receive proximity correction.

The optical proximity correction of the present invention is primarily concerned with the area of interest that is common to both the diffusion region 24, to the relatively straight polysilicon gates 14, 16, 18, 20, and also to the U-shape polysilicon gate 22. The common area between elements 14, 16, 18, 22 and 24 forms the electrical functions therebetween, such as transistors, which are of importance to the VLSI device. The optical proximity correction determination of the present invention may be further described with reference to FIG. 2.

Figure 2:
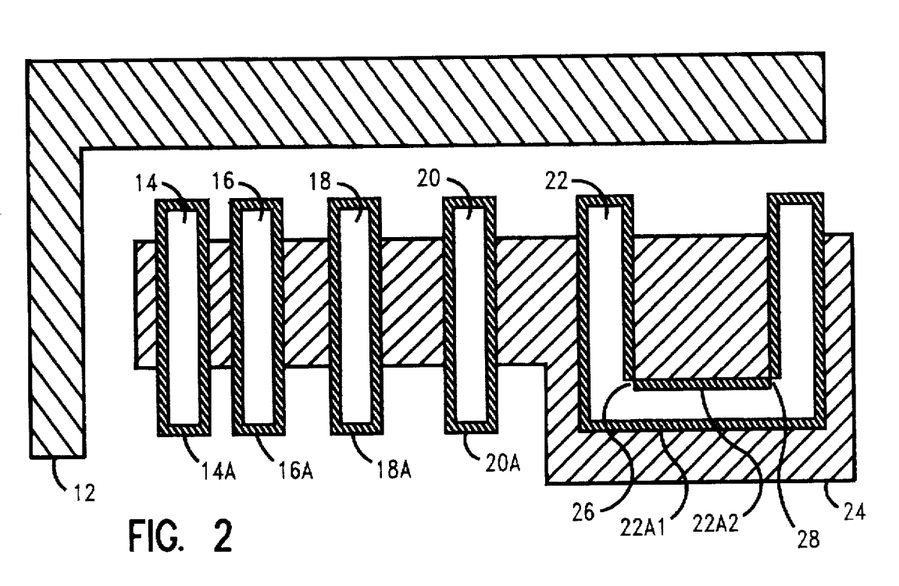
FIG. 2 illustrates the formation of the first set of edge projections involved in the creation of the optical proximity correction determination of the present invention.

As seen in FIG. 2, edge projection 14A, 16A, 18A and 20A are respectively added to gates 14, 16, 18 and 20 by Computer-Aided-Design (CAD) software techniques known in the art. The U-shaped polysilicon gate 22 has edge projections 22A1 and 22A2, each comprising a plurality of elements. Both are arranged together, in an overlapping manner, to provide a continuous structure therefor, except for corners 26 and 28 shown in FIG. 2. The edge projections 14A, 16A, 18A, 20A, 22A1 and 22A2, each preferably has a rectangle shape and each is located just inside the edge of its respective element. It should be noted that unlike prior art techniques that were restricted to modifying the overall shape of the elements 14, 16, 18, 20 and 22, the projections 14A, 16A, 18A, 20A, 22A1 and 22A2 are individually added to only the edges of their respective elements. This is a more precise adjustment and it reduces the residual processing induced critical dimension line width variations, discussed in the "Background of the Invention" section of the present invention by a factor of about two. The edge projections 14A, 16A, 18A and 20A, 22A1 and 22A2 are adjusted to take into account the common area with diffusion region 24 which form transistor elements therebetween and which adjustment may be further described with reference to FIG. 3.

Figure 3:
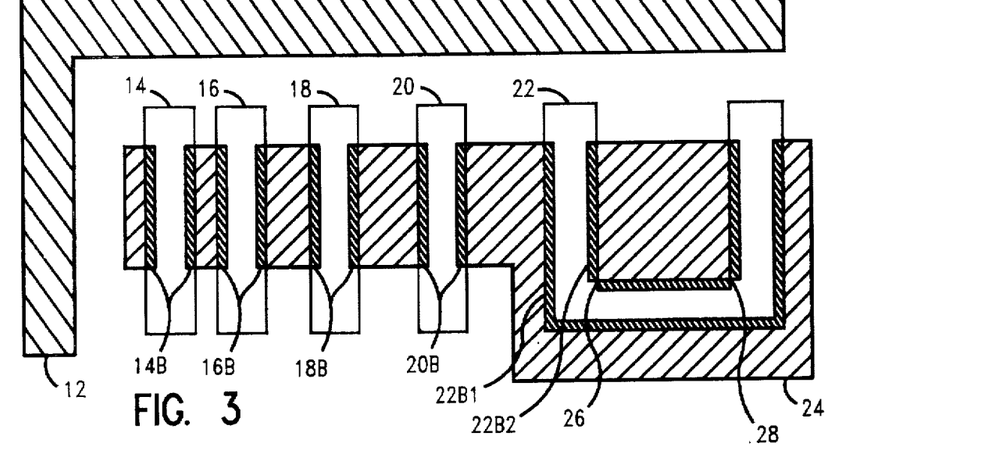
FIG. 3 illustrates the isolation of electrical relevant portions of the critical edges determined in FIG. 2.

As seen in FIG. 3, the gate elements 14, 16, 18, 20 and 22 and diffusion region 24 that affect the performance of the VLSI device now have edge projections illustrated as 14B, 16B, 18B, 20B, 22B1 and 22B2, respectively. The edge projections 14B, 16B, 18B, 20B, 22B1 and 22B2 are formed by CAD software techniques using a process that determines the area intersection between the edge projections 14A, 16A, 18A, 20A, 22A and the diffusion region 24. The edge projections 14B, 16B, 18B, 20B, 22B1 and 22B2 are subjected to a sorting process which establishes their proximity characteristics, and which may be further described with reference to FIG. 4.

Figure 4:
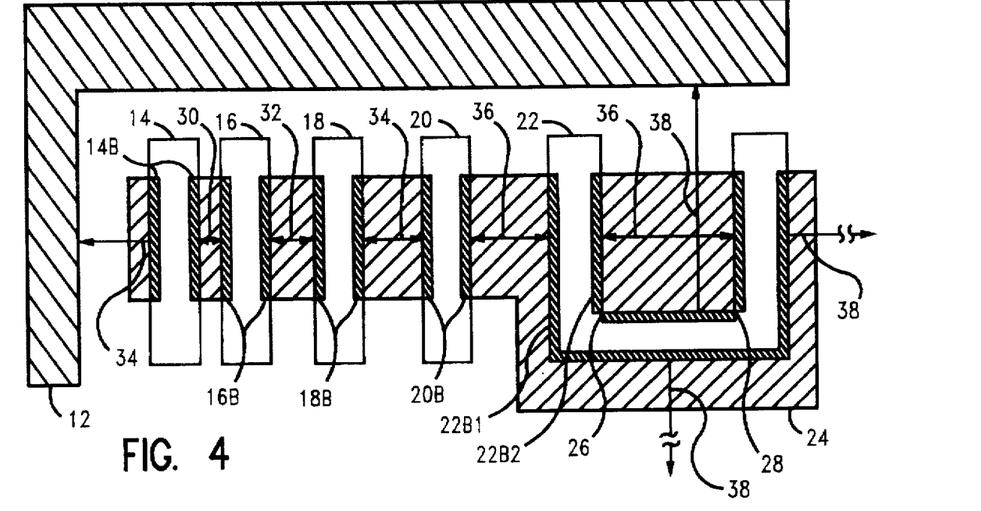
FIG. 4 illustrates the characterization of the critical edge projection shapes by sorting by their distance to the nearest opposing edge or any other characteristic.

As seen in FIG. 4, the edge projections 14B, 16B, 18B, 20B, 22B1 and 22B2 are shown as being spaced apart from each other or from an edge of the non-functional shape 12, and the spacings therebetween are indicated by distances 30, 32, 34, 36 and 38. The sorting/binning/bucketing illustrated in FIG. 4 based upon the spacing of edge projection to its nearest neighbor is only one technique contemplated by the practice of the invention. Other techniques, such as local pattern density, known in the art, may also be employed, as well as combinations of sorting/bucketing techniques.

The distance 38 is indicated more than once in FIG. 4 (also FIGS. 5 and 6 to be described) and some indications extend outwardly toward another element, but do not show the receiving end of the extension. All the showings of distance 38 represent an amount that is substantially equal to each other. Further, the distance 38, as well as the other distances 30, 32, 34, 36 and 38, need not be a fixed quantity but rather may be a range of quantities.

In the embodiment illustrated in FIG. 4, the quantity chosen to characterize the proximity environment of the critical feature edges is the distance to the nearest opposing edge. Once this quantity is accurately established for edge projections 14B . . . 22B1 and B2, the respective edge projections are sorted into the so called "buckets", according to predetermined proximity correction rules as illustrated in Table 1.

TABLE 1

| DISTANCE TO NEAREST NEIGHBOR IN ARBITRARY UNITS | CORRECTION BUCKET ACCORDING TO FIG. 4 | CORRECTION TO BE APPLIED IN DESIGN GRIDS |
| --- | --- | --- |
| 0–1.25 | 30 | +2 |
| 1.25–2.0 | 32 | +1 |
| 2.0–3.5 | 34 | 0 |
| 3.5–5.0 | 36 | −1 |
| 5.0–∞ | 38 | −2 |

Once the critical edge regions are sorted into the respective proximity buckets, the final optical proximity correction can be applied. However, if edge projections 14B . . . 22B1 and B2 were sized according to Table 1, and either added to or subtracted from the original design shapes 14–22, a large number of jogs would be introduced to the design. It is well known in the art that such jogs are undesirable. Therefore, it is a fundamental aim of this invention to eliminate these jogs by forming a second set of edge projections as illustrated in FIG. 5.

Figure 5:
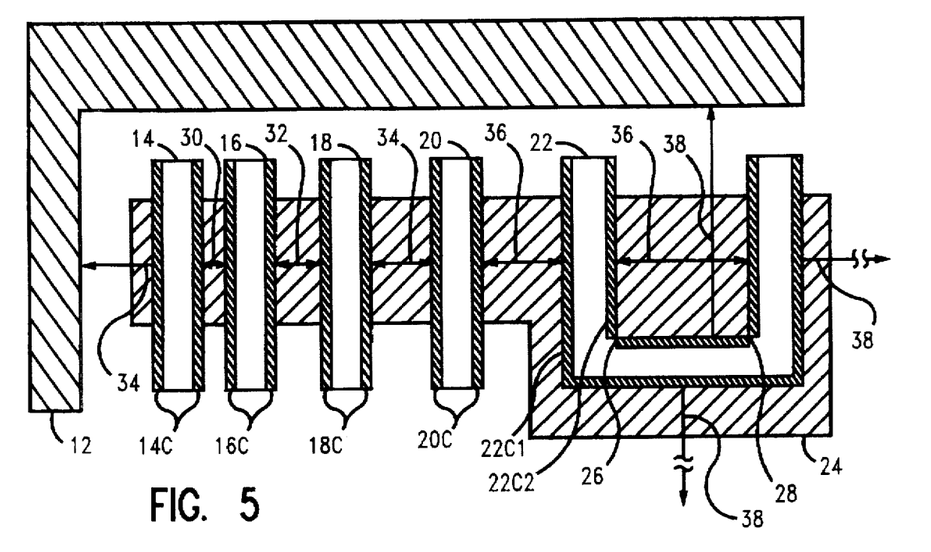
FIG. 5 illustrates the forming of a second set of full length edge projections and their classification based on the proximity characterization of electrically relevant sections of the overall feature edge generated in FIG. 4.

As seen in FIG. 5, a second set of edge projections 14C–22C1 and C2 is formed alongside the entire critical edge length of the relevant shapes 14–22. These full length edge projections are created along the entire length of an existing edge so as to eliminate the introduction of undesirable jogs. They are sorted into the proximity buckets of the critical edge sections which they cover in a manner so as to transfer the information on the proximity environment of the critical portion of the edge (14B–22B1 and B2 of FIG. 4) to the entire length of the edge (14C–22C1 and C2 of FIG. 5). It is these full length, sorted edge projections (14C–22C1 and C2) that are sized according to Table 1 and are either added to or subtracted from the original design as illustrated in FIGS. 6, 7 and 8.

Figure 6:
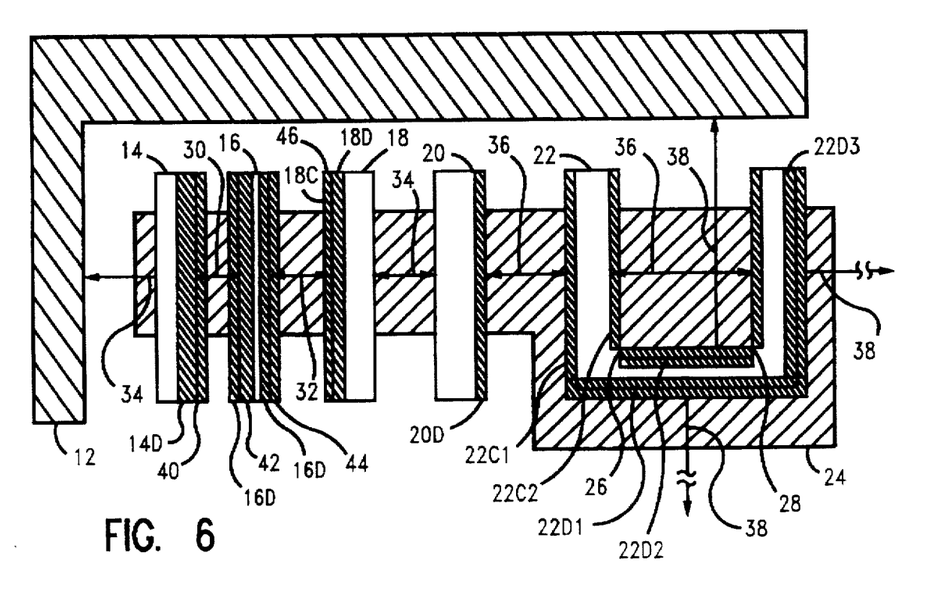
FIG. 6 illustrates the resizing of the critical features by either adding or subtracting the appropriately scaled edge projections created in FIG. 5.

FIG. 6 illustrates the resizing of the sorted edge projections 14C . . . 22C1 and C2 according to Table 1 to yield the edge shapes 14D . . . 22D1, D2 and D3. The resizing of the edge projections is accomplished by simply expanding (growing) the edge projection shapes. The tone of the desired correction, positive (addition-expansion) vs. negative (subtraction-shrink) is, at this point, of no great importance, since this determination is done by either adding the expanded shape 14D . . . 22D1 and D2 to the existing design to yield an expansion or a subtraction from the design to yield a shrink. To further eliminate the introduction of jogs it is desired to create shapes to fill discontinuities in the new edge topology as illustrated in FIG. 7.

Figure 7:
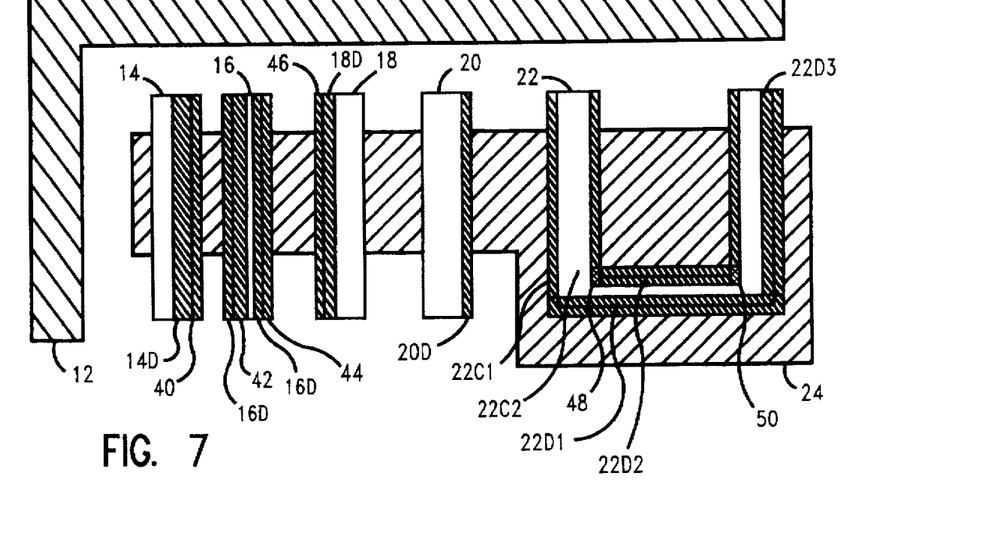
FIG. 7 illustrates the addition of overlapping ends to eliminate notches and extrusions in the corrected features to minimize mask manufacturing impact.

FIG. 7 shows the creation of corner fill shapes 48 and 50 by intersecting elongations of the scaled edge shapes 14D . . . 22D1, D2 and D3. These fill shapes are added to the collection of features that are targeted for subtraction from the original design 20D, 22D1 . . . 22D3 to yield a jog free edge after the proximity correction is applied as illustrated in FIG. 8.

Figure 8:
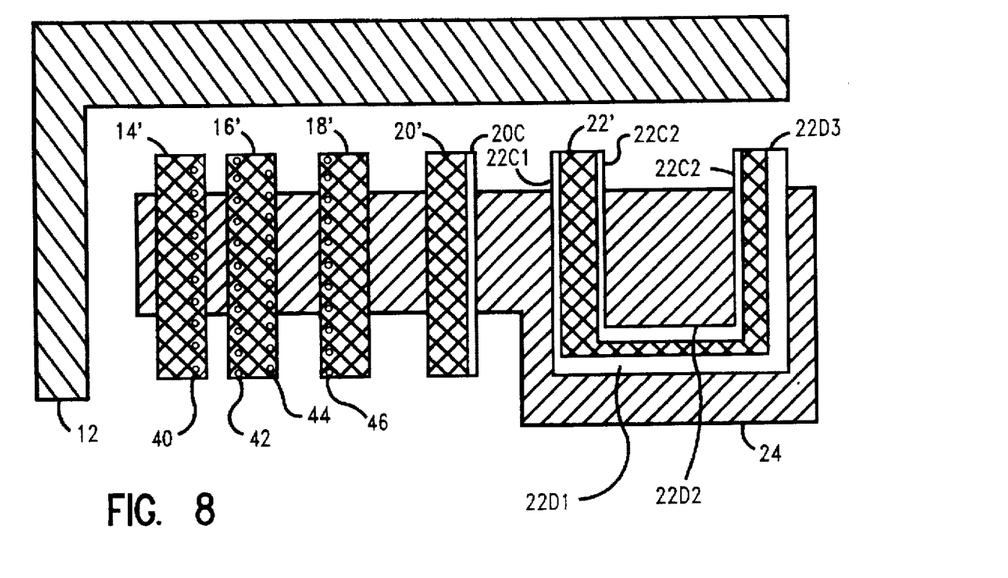
FIG. 8 illustrates the final optical proximity corrected photomask for a patterning process of a VLSI device.

FIG. 8 shows the final proximity corrected feature in solid black overlayed onto the original design in white. As dictated by the correction Table 1, some new edges extend beyond the original edges (dotted line) while others are pulled back from the original feature edge. This is accomplished by selectively adding or subtracting the compensation features 14D . . . 22D1, D2 and D3, 48 and 50 to the original design.

It should now be appreciated that the practice of the present invention provides for a method in which the structures of the VLSI device, such as the gate structure and the diffusion regions, that affect the operational performance of the VLSI device receive proximity correction and such correction is accomplished in an efficient manner.

Further, it should be appreciated that the present invention manipulates edge projections rather than the overall shapes of the elements receiving optical proximity correction.

It should be further appreciated that the practice of the present invention eliminates any notches or extrusions that might otherwise disadvantageously occur in the manipulated design.

Figure 9:
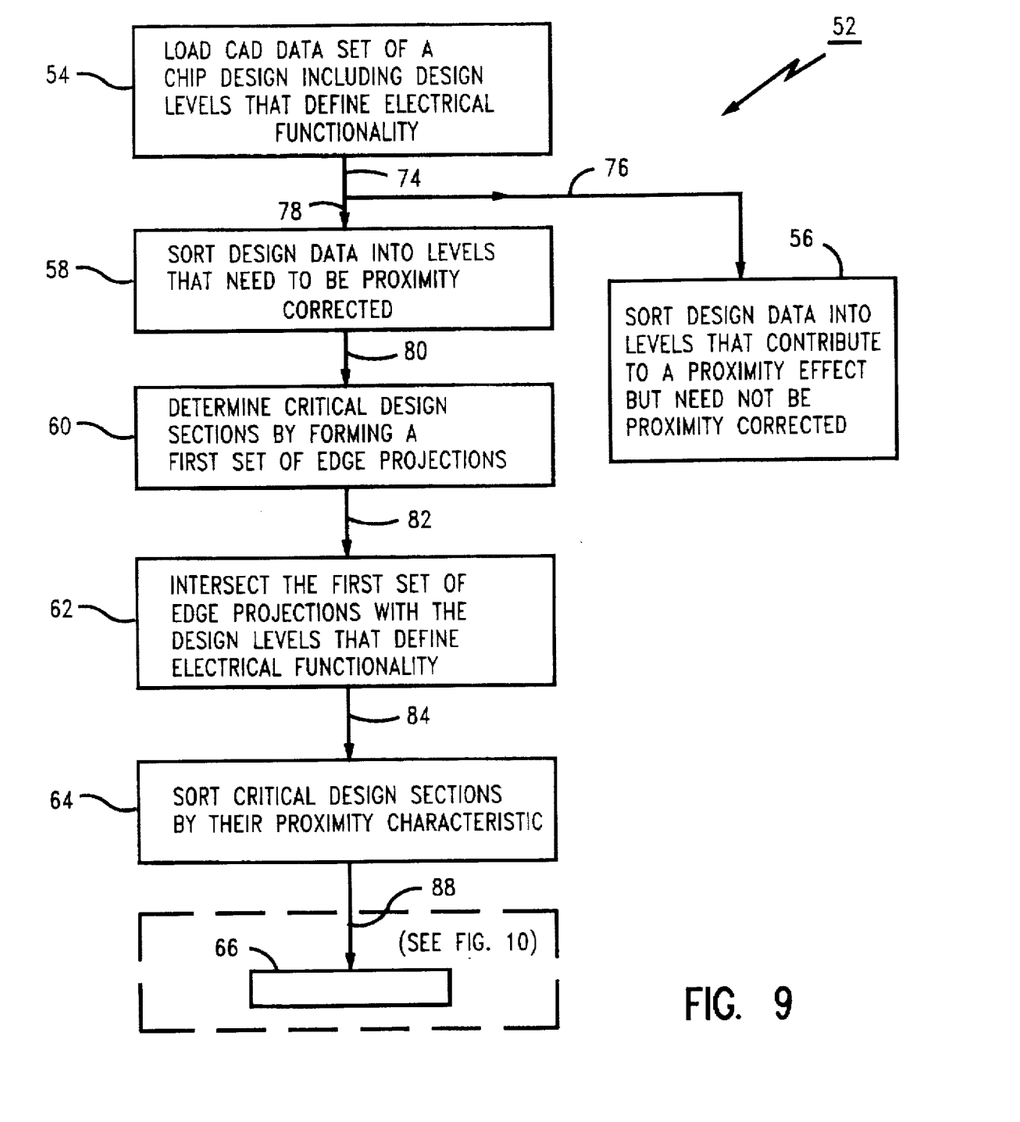
FIG. 9 illustrates a flow-chart related to one embodiment of the present invention.
Figure 10:
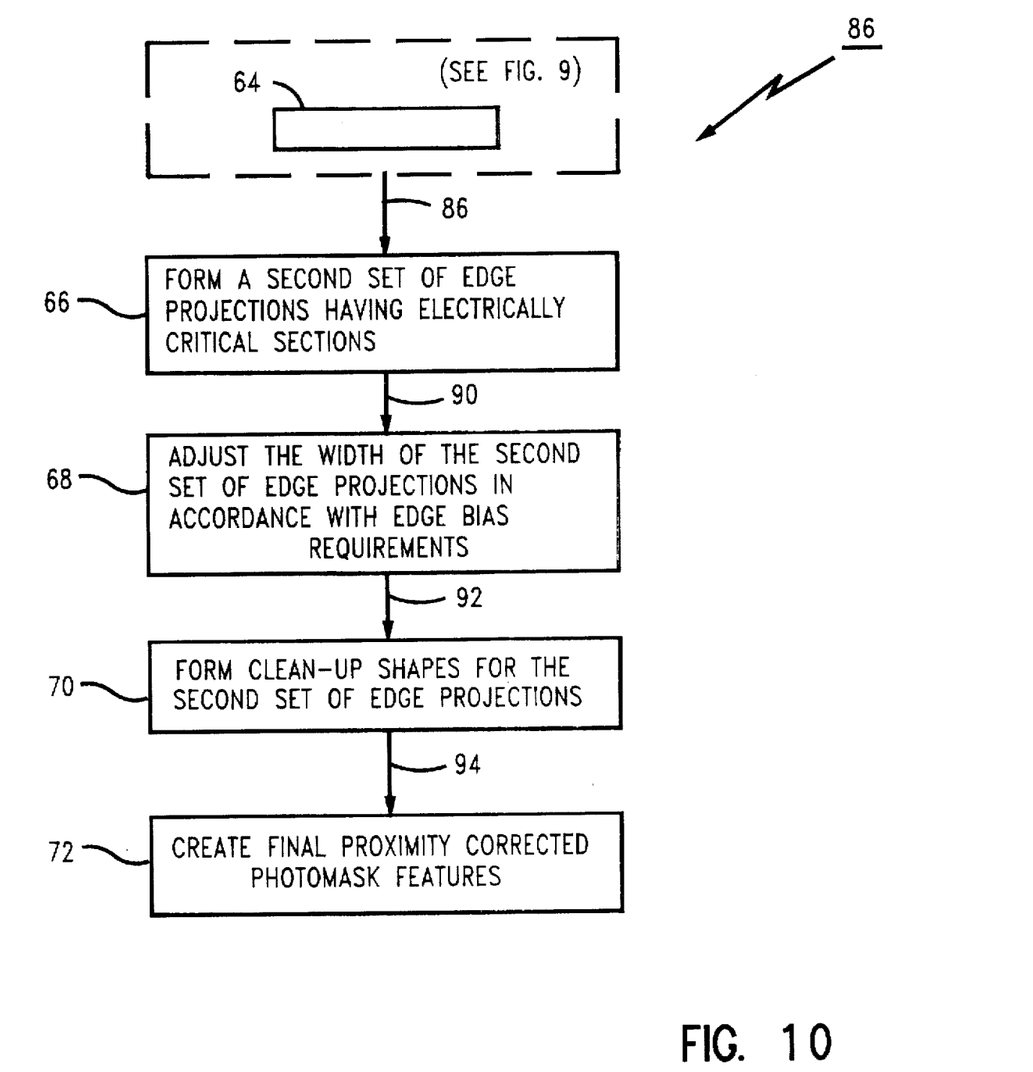
FIG. 10 illustrates a flow-chart continuing from the flow chart of FIG. 9 and related to a preferred embodiment of the present invention.

The overall method of the present invention is illustrated in FIGS. 9 and 10, wherein FIG. 9 covers the hereinbefore given description related to the geometry of the elements illustrated FIGS. 1–4, and FIG. 10 covers the hereinbefore given description related to the geometry of the elements illustrated in FIGS. 5–8. In general, the method illustrated in FIGS. 9 and 10 group the design shapes into three categories, with the first being those requiring proximity correction, the second being those contributing to the proximity environment, and the third being those defining chip functionality. FIG. 9 illustrates an overall step-by-step procedure 52 that is carried over to the step-by-step procedure of FIG. 10, and FIGS. 9 and 10 illustrate a plurality of processing segments tabulated in Table 2.

TABLE 2

| REFERENCE NO. | NOMENCLATURE |
| --- | --- |
| 54 | LOAD CAD DATA SET OF A CHIP DESIGN INCLUDING DESIGN LEVELS THAT DEFINE ELECTRICAL FUNCTIONALITY |
| 56 | SORT DESIGN DATA INTO LEVELS THAT CONTRIBUTE TO A PROXIMITY EFFECT BUT NEED NOT BE PROXIMITY CORRECTED |
| 58 | SORT DESIGN DATA INTO LEVELS THAT NEED TO BE PROXIMITY CORRECTED |
| 60 | DETERMINE CRITICAL DESIGN SECTIONS BY FORMING A FIRST SET OF EDGE PROJECTIONS |
| 62 | INTERCEPT THE FIRST SET OF EDGE PROJECTIONS WITH THE DESIGN LEVELS THAT DEFINE ELECTRICAL FUNCTIONALITY |
| 64 | SORT CRITICAL DESIGN SECTIONS BY THEIR PROXIMITY CHARACTERISTIC |
| 66 | FORM A SECOND SET OF EDGE PROJECTIONS HAVING ELECTRICALLY CRITICAL SECTIONS |
| 68 | ADJUST THE WIDTH OF THE SECOND SET OF EDGE PROJECTIONS IN ACCORDANCE WITH EDGE BIAS REQUIREMENTS |
| 70 | FORM CLEAN UP SHAPES FOR THE SECOND SET OF EDGE PROJECTIONS |
| 72 | CREATE FINAL PROXIMITY CORRECTED PHOTO MASK FEATURES |

As seen in FIG. 9, the first step of the method of the present invention is to load the CAD data set that includes all of the design levels for the preselected VLSI device or chip, especially those levels that constitute the mask level to be proximity corrected and the accompanying design levels that define electrical functionality. The design levels of electrical functionality, as used herein, include all levels or parameters that effect the functionality of the VLSI device being fabricated. For example, as discussed with reference to FIGS. 1–8, the gate structure, as defined by its geometric and operational parameters, affects the performance of the VLSI device. More particularly, the polysilicon gates 14, 16, 18, 20, 22 of FIG. 1, as well as the diffusion region 24 of FIG. 1 that make up respective transistors affect the operational performance of the VLSI device and, therefore, by the practice of the present invention, receive optical proximity correction. After the loading of the CAD data set of step 54 is completed, the loaded information is provided on output path 74 which is directed to process segment 56, via signal path 76, and to process segment 58 via signal path 78.

The process segment 56 concerns itself with the structure elements, such as structure element 12 of FIG. 1, which are electrically non-functional elements, such as a fill pattern that does not need optical proximity correction but its location must still be taken into account to determine its affect on the other electrical functional elements, such as polysilicon gates 14, 16, 18, 20, and 22, which do require optical proximity correction.

The process segment 58 selects the levels of the design data sets that cover the electrical functional elements, such as, polysilicon gates 14, 16, 18, 20 and 22, all of which are to receive optical proximity correction by determining their interaction with the diffusion region 24. The information gathered by process 58 is placed on signal path 80 which is directed to process segment 60.

The process segment 60 determines the critical design sections by forming the first set of edge projections 14A, 16A, 18A, 20A, 22A1 and 22A2, previously described with reference to FIG. 2. After the first set of edge projections 14A, 16A, 18A, 20A, 22A1 and 22A2 is formed, the information defining these geometric shapes is placed on signal path 82, which is directed to process segment 62.

The process segment 62 has sequential routines that further modify the geometric structure of edge projections 14A, 16A, 18A, 20A, 22A1 and 22A2 in the manner previously discussed with reference to FIG. 3, in which the edge projections 14B, 16B, 18B, 20B, 22B1 and 22B2 are derived in accordance with their electrical functionality. For example, when dealing with a gate structure, the gate level is intersected with the diffusion level. More particularly, the edge projections 14B, 16B, 18B, 20B, 22B1 and 22B2 are created by the intersection of the edge projections 14A, 16A, 18A, 20A and 22A with the diffusion level 24. Upon such derivation, the information defining these intersection regions is placed on signal path 84 which is directed to process segment 64.

The process segment 64 is related to sorting the critical design sections by their proximity characteristic and in a manner as previously described with reference to the illustration of FIG. 4. At this point in the process, the final proximity corrected outputs may be derived but, as previously described, if the optical proximity correction were performed on edge projections illustrated in FIG. 4, it would produce a large number of undesired jogs. The present invention avoids this by allowing the information provided by process segment 64 to be directed on signal path 88 to the process segment 66 of FIG. 10.

The process segment 66 forms a second set of edge projections 14C, 16C, 18C, 20C, 22C1 and 22C2 in the manner previously described with reference to the illustration of the geometry shown in FIG. 5. Upon the creation of the second set of edge projections 14C, 16C, 18C, 20C, 22C1 and 22C2, the information thereof is made available on signal path 90 which is routed to process segment 68.

The process segment 68 adjusts the widths of the edge projections carried by the polysilicon gates 14, 16, 18, 20 according to Table 1 and as discussed with reference to FIG. 6. As previously mentioned, the sorting may also be accomplished by process segment 68 by other techniques known in the art, such as local pattern density. The results of process segment 68 are placed on signal path 92, which is routed to process segment 70.

The process segment 70 creates the clean up shapes, such as shapes 48 and 50 previously discussed with reference to FIG. 7. Further, the clean-up process removes from or adds on the edge projections and sections to the polysilicon gates 14, 16, 18, 20 and 22, in the manner discussed with reference to FIG. 7. After such clean-up shapes are developed, the results of the process segment 70 are routed to process segment 72 via signal path 94.

The process segment 72 creates the final proximity corrected photomask features in the manner previously described with reference to the illustration of FIG. 8, in particular, with reference to polysilicon gates 14', 16', 18', 20', and 22'. Once the proximity corrected photomask features are accomplished, the method of the present invention routes the information defining the polysilicon gates 14', 16', 18', 20', and 22', such as their geometric dimensions, to external equipment, such as an appropriate computer running appropriate application programs (known in the art), to further structure the design data in preparation of the manufacturing of the desired photo mask.

It should now be appreciated that the practice of the present invention provides for a method in which the photomask features that are critical to the performance of a very large scale integrated (VLSI) device, and which are prioritized before any optical proximity corrections are provided therefor so as to reduce the processing time for the VLSI devices.

It should be further appreciated that the practice of the present invention provides the photomask features that are critical to the performance of the VLSI device in such a manner to eliminate any notches.

What is claimed is:

1. A method for performing optical proximity correction to control the accuracy in VLSI patterning operations, said method comprising the steps of:
    a) inputting a design data set that define a preselected chip design including design levels that define electrical functionality parameters of said chip;
    b) sorting said design data set into levels that need to be proximity corrected and into levels that contribute to a proximity effect but need not be proximity corrected;
    c) gathering said levels that need to be proximity corrected and forming a first set of edge projections;
    d) intersecting said first set of edge projections with said design levels that define electrical functionality and gathering the common sections therebetween;
    e) sorting said common sections by their proximity correction characteristic; and
    f) creating said sorted common sections into final proximity corrected photomask features.

2. The optical proximity correction method according to claim 1, wherein said design data set levels that are proximity corrected include gate and diffusion structures.

3. The optical proximity correction method according to claim 1, wherein said design data set levels that are not critical to the operational performance of said chip are not to be proximity corrected.

4. The method for performing optical proximity correction according to claim 1 further comprising the below steps to be performed after step d) and before step f) of claim 1:
    a) forming a second set of edge projections having electrically critical parameters;
    b) adjusting the width of said second set of edge projections in accordance with edge proximity correction parameters; and
    c) forming clean-up shapes for said second set of edge projections.

5. The optical proximity correction method according to claim 4, wherein said first and second set of edge projections, each having a shape comprising a rectangle.

6. The optical proximity correction method according to claim 4, wherein said second set of edge projections have overlapping portions.

7. The optical proximity correction method according to claim 4, wherein said edge proximity correction parameters take into account the spacing between adjacent edges of said second set of edge projections.

8. The optical proximity correction method according to claim 7, wherein said clean-up shapes take into account said edge proximity correction parameters.

9. A method for performing optical proximity correction to control the accuracy in VLSI patterning operations, said method comprising the steps of:
    a) inputting a design data set that define a preselected chip design including design levels that define electrical functionality parameters of said chip;
    b) sorting said design data set into levels that need to be proximity corrected and into levels that contribute to a proximity effect but need not be proximity corrected;
    c) gathering said levels that need to be proximity corrected and forming a first set of edge projections;
    d) intersecting said first set of edge projections with said design levels that define electrical functionality and gathering the common sections therebetween;
    e) sorting said common sections by their proximity correction characteristic;
    f) forming a second set of edge projections having electrically critical parameters;
    g) adjusting the width of said second set of edge projections in accordance with edge proximity correction parameters;
    h) forming clean-up shapes for said second set of edge projections; and
    i) creating said sorted common sections into final proximity corrected photomask features.

10. The optical proximity correction method according to claim 9, wherein said design data set levels that are proximity corrected include gate and diffusion structures.

11. The optical proximity correction method according to claim 9, wherein said design data set levels that are not critical to the operational performance of said chip are not to be proximity corrected.

12. The optical proximity correction method according to claim 11, wherein said first and second set of edge projections each has a shape comprising a rectangle.

13. The optical proximity correction method according to claim 11, wherein said second set of edge projections have overlapping portions.

14. The optical proximity correction method according to claim 11, wherein said edge proximity correction parameters take into account the spacing between adjacent edges of said second set of edge projections.

15. The optical proximity correction method according to claim 14, wherein said clean-up shapes takes into account said edge proximity correction parameters.

16. A method employing a bucket sorting technique for performing optical proximity correction to control the accuracy in VLSI patterning operations, said method comprising the steps of:
    a) inputting a design data set that define a preselected chip design including design levels that define electrical functionality parameters of said chip;
    b) sorting said design data set into levels that need to be proximity corrected and into levels that contribute to a proximity effect but need not be proximity corrected;
    c) gathering said levels that need to be proximity corrected and forming a first set of edge projections;
    d) intersecting said first set of edge projections with said design levels that define electrical functionality and gathering the common sections therebetween;
    e) sorting by said bucket technique said common sections by their proximity correction characteristic;
    f) forming a second set of edge projections having electrically critical parameters;
    g) adjusting the width of said second set of edge projections by said bucket technique in accordance with edge proximity correction parameters;
    h) forming clean-up shapes for said second set of edge projections; and
    i) creating said sorted common sections into final proximity corrected photomask features.

17. The optical proximity correction method according to claim 16, wherein said design data set levels that are proximity corrected include gate and diffusion structures.

18. The optical proximity correction method according to claim 16, wherein said design data set levels that are not critical to the operational performance of said chip are not to be proximity corrected.

19. The optical proximity correction method according to claim 18, wherein said first and second set of edge projections each has a shape comprising a rectangle.

20. The optical proximity correction method according to claim 18, wherein said second set of edge projections have overlapping portions.

21. The optical proximity correction method according to claim 18, wherein said edge proximity correction parameters take into account the spacing between adjacent edges of said second set of edge projections.

22. The optical proximity correction method according to claim 21, wherein said clean-up shapes takes into account said edge proximity correction parameters.

23. The optical proximity correction method according to claim 18, wherein said second set of edge projections are formed alongside said first set of edge projections.

* * * * *